United States Patent [19]
Tanaka

[11] Patent Number: 5,537,599
[45] Date of Patent: Jul. 16, 1996

[54] CPU CONTROLLED APPARATUS FORMED ON AN IC

[75] Inventor: Toshimasa Tanaka, Kyoto, Japan

[73] Assignee: Rohm Co., Ltd., Kyoto, Japan

[21] Appl. No.: 231,938

[22] Filed: Apr. 25, 1994

[51] Int. Cl.⁶ .............................. G06F 1/26; G06F 1/08; G06F 9/24; G06F 1/24
[52] U.S. Cl. ................ 395/750; 365/229; 364/DIG. 1; 364/DIG. 2; 395/550; 395/182.2
[58] Field of Search ................................ 395/800, 750, 395/575, 775, 325, 200, 725, 550, 495, 182.2; 371/10.2, 10.2, 14, 66; 364/707, 431.11, DIG. 1, DIG. 2, 483, 410, 480; 365/229, 228; 307/64, 65, 66; 370/58.2; 340/825.06, 825.52

[56] References Cited

U.S. PATENT DOCUMENTS

| | | | |
|---|---|---|---|
| 3,906,453 | 9/1975 | Mattedi et al. | 395/550 |
| 4,316,248 | 2/1982 | Retter | 395/575 |
| 4,400,772 | 8/1983 | Broyles et al. | 395/325 |
| 4,527,798 | 7/1985 | Siekierski et al. | 364/410 |
| 4,779,007 | 10/1988 | Schlanger et al. | 307/66 |
| 4,782,468 | 11/1988 | Jones et al. | 371/66 |
| 4,791,629 | 12/1988 | Burns et al. | 370/58.2 |
| 5,315,533 | 5/1994 | Stich et al. | 364/480 |
| 5,408,672 | 4/1995 | Miyazawa et al. | 395/800 |

FOREIGN PATENT DOCUMENTS

| | | |
|---|---|---|
| 0268419A2 | 5/1988 | European Pat. Off. |
| 0420994A1 | 4/1991 | European Pat. Off. |

OTHER PUBLICATIONS

Maxim 1992 Analog Design Guide Series Book 1, MAX696 pages 5–33 to 5–44.

Primary Examiner—Daniel H. Pan
Attorney, Agent, or Firm—Nikaido, Marmelstein, Murray & Oram

[57] ABSTRACT

In a game software apparatus, a ROM incorporating a program, a decoder for supplying a selection signal of the ROM, a backup RAM for holding a function from a CPU incorporated in a game machine and a decoder for controlling the RAM are activated by a power supplied from the game machine. When the power from the game machine is cut off, the power source is changed by a changeover circuit so that power is supplied from a battery incorporated in the game software apparatus to the RAM and to the decoder while the power from the game machine is being cut. The two decoders and the changeover circuit are provided on a one-chip IC.

6 Claims, 3 Drawing Sheets

CPU CONTROLLED APPARATUS FORMED ON AN IC

BACKGROUND OF THE INVENTION

1. Field of the Invention

The present invention relates to an apparatus such as a game apparatus which is operated by a control of a central processing unit (CPU) for executing a control program.

2. Description of the Prior Art

An apparatus operating on the power supply from a power source generally uses the commercial alternating current (AC) power supply. Since it is inconvenient that a function of such an apparatus is started again from the beginning when the power supply is started again after the commercial AC power supply is cut due to power failure or after the apparatus is turned off, the function being performed at the time when the power is cut is backed up so that the function is continuously performed when the power supply is restored. During such a backup period, a battery is used as the power source. In order to reduce the power consumption of the battery to the minimum, it is preferable to back up only the irreducible minimum of the circuits in the apparatus with the battery. Therefore, in the case of an apparatus operated by a central processing unit (CPU), a memory such as a random access memory (RAM) is provided to maintain a program or a data activated while the power is being supplied at the point of time when the power is cut. The program or the data is successively stored in the RAM in advance while the power is being supplied. In a conventional arrangement of FIG. 1, an address command data from a CPU 30 is decoded firstly by a first circuit 31 and then by a second circuit 32, thereby obtaining an address of a read only memory (ROM) 33. It is impossible to use an output of the first circuit 31 without any processing. This output is not usable until it is further decoded by the second circuit 32. In this conventional arrangement, at least two ICs (31 and 32) are used. This is because the circuit is constructed by using a general purpose IC since no integrated circuit (IC) specifically used to decode an address command data from a CPU is provided. A third circuit 34 is used to supply a selection signal from the CPU 40 to a RAM 35. To the RAM 35, a new program address is written in accordance with the progress of the program. With respect to the power source, power from an AC adapter 36 is supplied to the CPU 30, to the first and second circuits 31 and 32 and to the ROM 33. Selection between the power from the AC adapter 36 and the power from a battery 37 is automatically made by diodes D1 and D2. The selected power is provided to the third circuit 34 and to the RAM 35. In this case, when power is output from the AC adapter 36, the diode D1 is ON and the diode D2 is OFF, so that power from the AC adapter 36 is selected. When no power is output from the AC adapter 36, the diode D1 is OFF and the diode D2 is ON, so that power from the battery 37 is selected.

In this conventional arrangement, however, since a plurality of circuits are used to decode the addressing data from the CPU 30 (i.e. the addressing data is decoded by the first and second circuits 31 and 32) to thereby obtain the selection signal (address) of the ROM 33, the processing line to the ROM 33 is long. As a result, the signal delay between the input and the output increases. This is because there are stages of gates constituting the first and second circuits 31 and 32 provided in series and because delay is caused by distributed capacity of a connecting line between ICs. A signal for selecting the RAM 35 provided through the third circuit 34 is delayed in a similar manner.

If the delay of the selection signal increases, the reading of a program data at the ROM 33 and the reading and writing at the RAM 35 will be delayed, so that the timing of the entire game apparatus does not concur with that of the CPU 30. Moreover, since the diodes D1 and D2 which are discrete parts are used to select the power source, a power loss is caused due to a voltage drop by the diodes D1 and D2. Further, because of the diodes D1 and D2 and the circuits 31, 32 and 34, the number of parts and the space on the circuit board occupied by those parts increase.

SUMMARY OF THE INVENTION

An object of the present invention is to provide an apparatus in which the signal delay and the power loss are reduced to the minimum and the number of parts is small.

According to the present invention, an apparatus operated by a CPU is provided with a first memory for storing a control program, a second memory for storing an address of the control program, specifying means for specifying an address to be stored in the second memory, a first controlling circuit for outputting a data from the first memory according to a data from the central processing unit, a second controlling circuit for writing an address data of the control program into the second memory according to a data from the central processing unit, a first power source for a normal operation, a second power source for backup purpose, a first power line connected to the first power source, to the first memory and to the first controlling circuit, a second power line connected to the second power source, and a changeover circuit for connecting the second controlling circuit and the second memory to the first power line when a power is supplied from the first power source to the first power line and for connecting the second controlling circuit and the second memory to the second power line when no power is supplied from the first power source to the first power line. The first and second controlling circuits and the changeover circuit are provided on a one-chip semiconductor substrate.

According to the present invention, since the controlling circuits are formed as one IC, the arrangement that an IC and an IC are connected is unnecessary. Moreover, since the number of gates provided in series is generally small, the signal line is short, and the delay caused on the signal processing line is reduced accordingly. Further, since the power changeover circuit is formed in the IC in which the first and second controlling circuit are formed, the power changeover circuit can be formed by a device in which no voltage drop occurs or the voltage drop is small.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
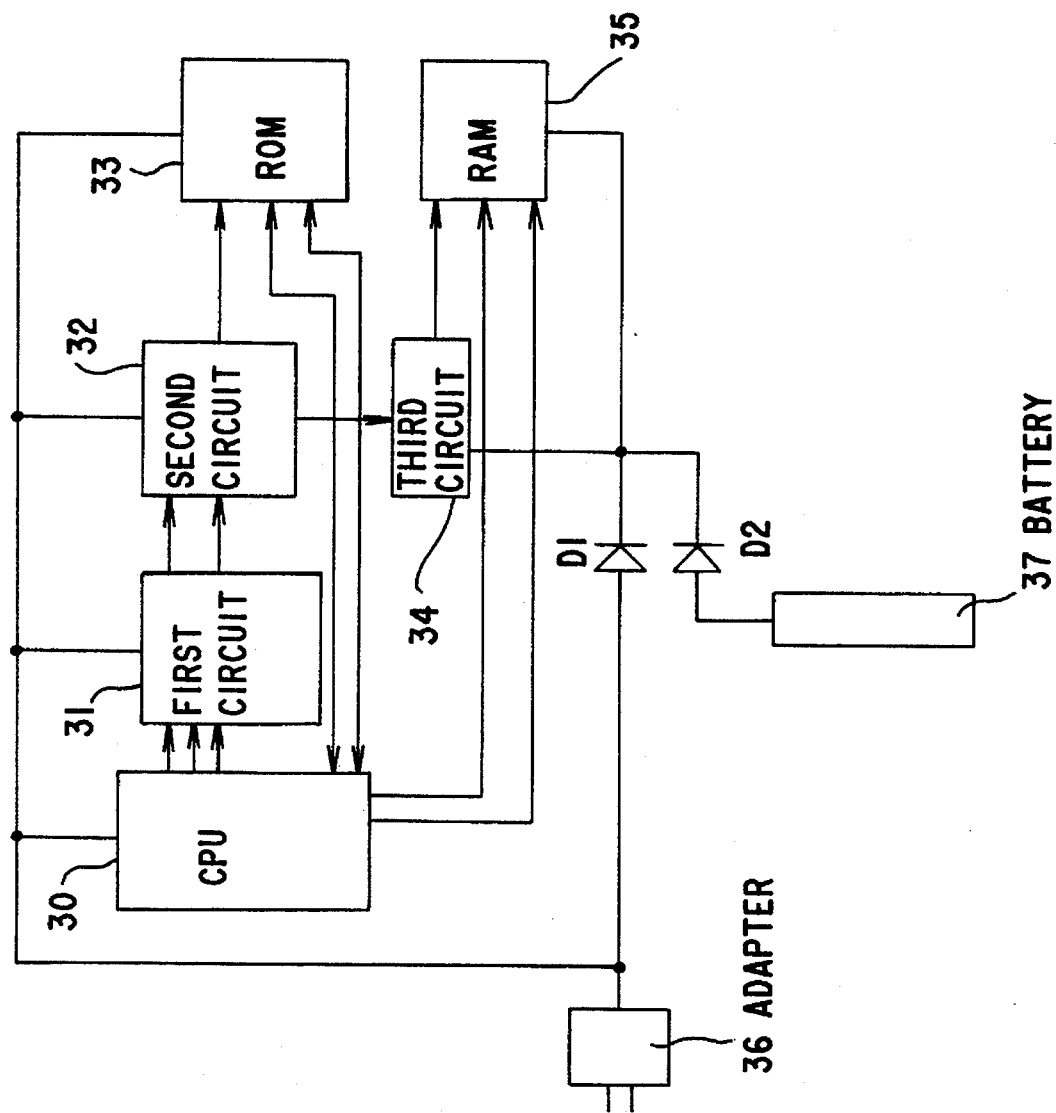
FIG. 1 is a block circuit diagram of a conventional apparatus.
Figure 2:
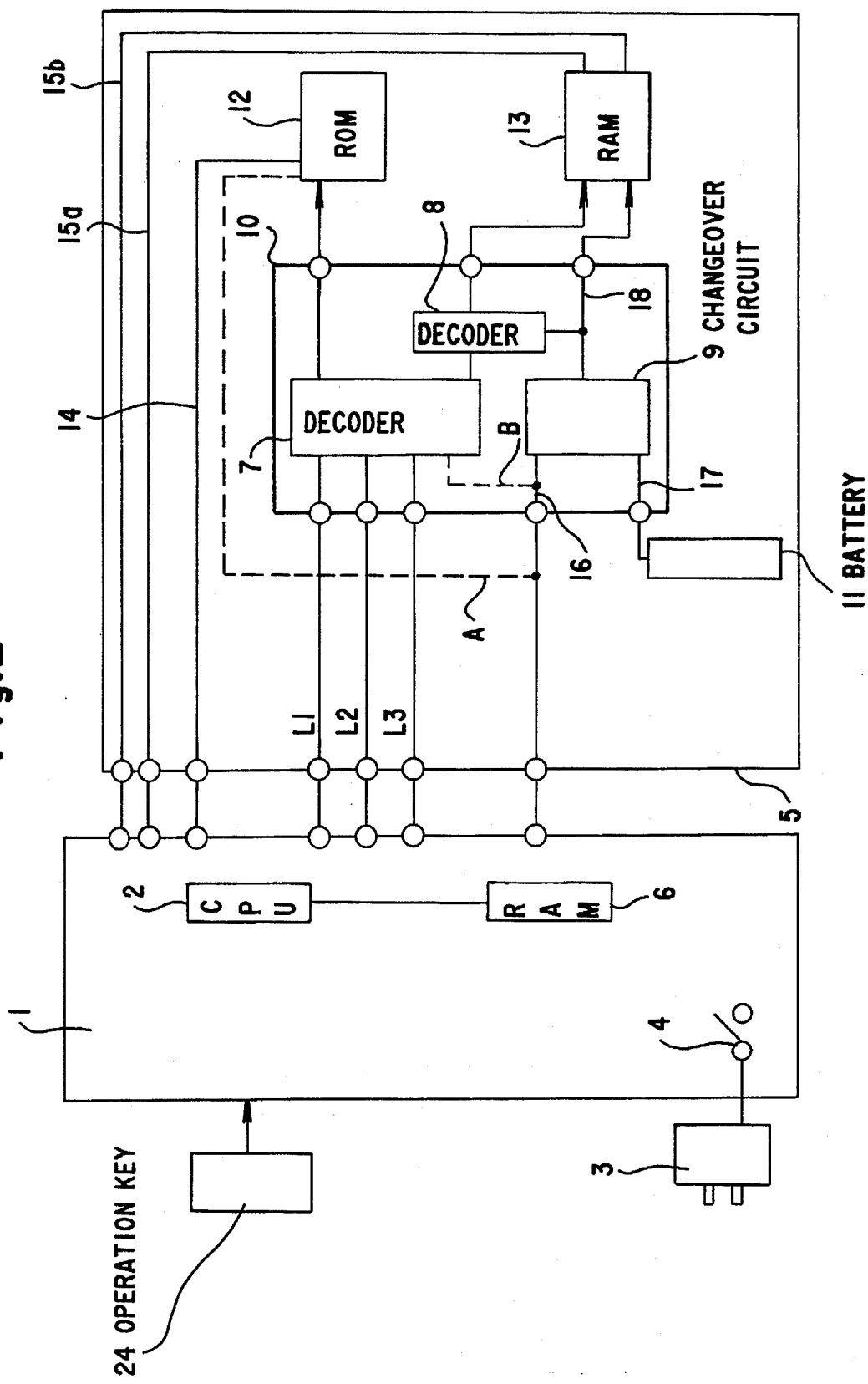
FIG. 2 is a block circuit diagram of a game apparatus embodying the present invention.

Hereinafter, an embodiment of the present invention will be described with reference to the drawings. Referring to FIG. 2, reference numeral 1 represents a game machine, which is provided with a CPU 2 for controlling the entire apparatus and a work RAM 6 for executing a game. Reference numeral 24 represents an operation key for setting a preservation of a program address. Reference numeral 3 represents an AC adapter connected to the game machine 1. The AC adapter 3 converts, for example, a 100 V commercial AC voltage into a 10 V direct current (DC) voltage and supplies it to the game machine 1. The game machine 1 is provided with a switch 4 for turning on and off the power. Reference numeral 5 represents a game software apparatus detachably attached to the game machine 1. The game software apparatus 5 is provided with a one-chip IC 10, a battery 11, a ROM 12 incorporating a game program and a RAM 13 for storing an address of the program.

The IC 10 is provided with decoders 7 and 8 for decoding an address data from the CPU 2, and a power changeover circuit 9. An address signal which is an output from the decoder 7 (first controlling circuit) is supplied to the ROM 12 to read out the program stored in the ROM 12. The program read out from the ROM 12 is transmitted from the game software apparatus 5 to the game machine 1 through a bus 14. The decoder 8 (second controlling circuit) decodes the address data transmitted from the CPU 2 to select the RAM 13 and supplies the decoded data to the RAM 13. When the operation key 24 is operated, an address data of the game program at that time is transmitted from the CPU 2 through a bus 15a and stored in the RAM 13. The data read out from the RAM 13 is output to a bus 15a and transmitted from the game software apparatus 5 to the game machine 1. The bus 15b is provided to command the reading/writing of the RAM 13.

Reference numeral 16 represents a first power line connected to the game machine 1, through which power is supplied from the game machine 1. To the first power line 16, the decoder 7 and the ROM 12 are connected. The connections are indicated by dotted lines A and B. Reference numeral 17 represents a second power line connected to the battery 11 provided in the game software apparatus 5. The voltage supplied from the battery 11 is approximately 3 V, which is lower than the voltage (5 to 10 V, in this case, 5 V) supplied from the game machine 1 to the power line 16.

Figure 3:
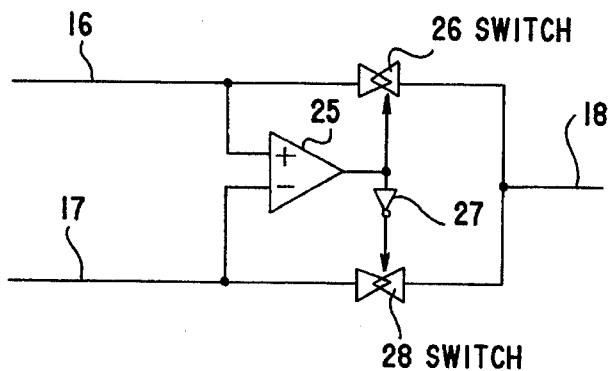
FIG. 3 is a detailed circuit diagram of a power changeover circuit of the game apparatus.

Reference numeral 9 is a power changeover circuit, an output line 18 of which is connected to the decoder 8 and the RAM 13. The first and second power lines 16 and 17 and the output line 18 are partly included in the IC 10. The power changeover circuit 9 supplies the output line 18 with power from the first power line 16 when power is supplied from the game machine 1 to the first power line 16, and supplies the output line 18 with power from the battery 11 when no power is supplied to the first power line 16. No power is supplied to the first power line 16, for example, when the AC adapter 3 is not plugged in to an outlet, when the main switch 4 is OFF and when a power failure occurs. The power changeover circuit 9 includes, as shown in FIG. 3, a comparator 25 for comparing the voltage on the line 16 and the voltage on the line 17, analog switches 26 and 28 inserted in the lines 16 and 17, respectively, and an inverter 27 for inverting an output of the comparator 25 to apply it to the analog switch 28. When a voltage is being applied to the line 16, since the voltage on the line 16 is higher than the voltage on the line 17, the output of the comparator 25 is of high level, thereby activating the analog switch 26. At this time, the analog switch 28 is cut off since a low-level voltage is applied thereto through the inverter 27. As a result, a voltage from the line 16 is applied to the output line 18. When no voltage is being applied to the line 16, since the output of the comparator 25 is of low level, the analog switch 26 is cut off. At this time, the analog switch 28 is activated since a high-level voltage is applied thereto from the inverter 27. As a result, a voltage from the line 17 is applied to the output line 18.

Referring now to FIG. 2, an operation of the apparatus will be described. When the game software apparatus 5 is attached to the game machine 1 and the first power line 16 is supplied with power, in response to the start operation of the game, an addressing data is input from the CPU 2 of the game machine 1 through buses L1 and L2 to the game software apparatus 5. This data is decoded by the decoder 7. The decoded data is supplied to the ROM 12. Then, the program read out from the ROM 12 is transmitted through the bus 14 to the game machine 1, so that the program is executed by the CPU 2. A bus L3 is provided for another data. For example, an enabling signal of the ROM 12 is transmitted thereto. The RAM 6 incorporated in the game machine 1 is provided to execute various operations necessary for performing the game. When the user operates the operation key 24 while the game is being performed, an address data of an address of the program at that time, i.e. an address data of an address of the ROM at that time is transmitted from the CPU 2 through the bus 15a to the game software apparatus 5. When this happens, an address (selection signal) for selecting the RAM 13 is transmitted from the CPU 2 through the buses L1 and L2. This address is decoded by the decoder 8 and supplied to the RAM 13. Simultaneously, a writing command signal is supplied through the bus 15b to the RAM 13. As a result, the address data of the program transmitted through the bus 15a is written into the RAM 13. The data written in the RAM 13 is held as it is in the RAM 13 as far as the operation key 24 is not operated again. This data is backed up by the power from the battery 11 when no power is provided to the line 16, for example, due to power failure. The reading of the data from the RAM 13, i.e. the reading of the address data of the game program stored in the RAM 13 is performed in response to a command from the CPU 2 based on a key operation (a resuming key operation) by the user. The data read out from the RAM 13 is output to the bus 15a to be transmitted to the game machine 1.

The system of the present invention having a function to write to the RAM 13, hold, read out from the RAM 13 and use a game condition during the game in response to a command from the CPU 2 is advantageous in the following regard. Generally, when a game ends in a failure, it is necessary to start the game again from the beginning. This is often waste of time to the user. On the contrary, it would be convenient if it is possible to turn back midway to start the game therefrom. The user operates the operation key 24 during the game. Then, an address of the program at that time is stored in the RAM 13. As a result, even if the game ends in a failure thereafter, the address data is read out from the RAM 13 so that the user may start the game from the mid-condition of the game.

During a normal operation when the power from the first power line 16 is supplied, a game operation is performed based on an address command from the CPU 2. When no power is supplied to the first power line 16 under this condition, the decoder 7 and the ROM 12 are deactivated; however, the decoder 8 and the RAM 13 remain activated since they are provided with power from the battery 11 by the changeover circuit 9. At this time, however, the supply voltage applied to the decoder 8 is changed from 5 V from the game machine 1 to 3 V from the battery 11. The decoder 8 further operates to inhibit the writing to the RAM 13, whereby the data which have been written in the RAM 13 by the time the power source is changed are maintained intact.

When the power from the first power line 16 is restored, since the previous data maintained in the RAM 13 are input to the CPU 2 through the bus 15a if a predetermined key operation is performed, the CPU 2 provides a command to proceed to the next address. Thereby, when the power from the first power line 16 was cut and restored thereafter, the game machine resumes the game based on a program continued from the program stored in the RAM 13. At this time, the changeover circuit 9 supplies the power from the power line 16 to the decoder 18 and to the RAM 13 through the output line 18.

The game software apparatus 5 has a plurality of lines of terminal pins (not shown) at its left end. By inserting these terminal pins into a plurality of lines of sockets (not shown) of the game machine 1, the game software apparatus 5 is attached and electrically connected to the game machine 1. The game machine 1 is provided with a manual operation member. The user plays the game by operating this operation member.

Figure 4:
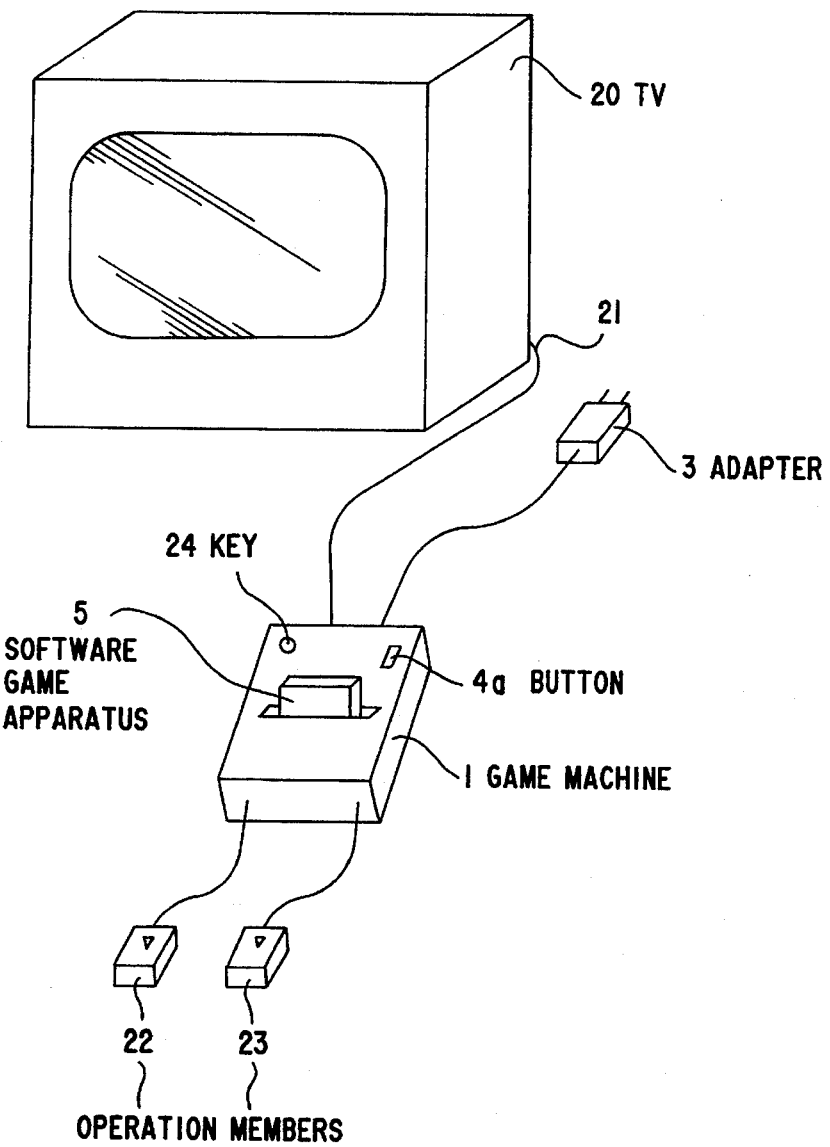
FIG. 4 is a conceptional view showing the apparatus of FIG. 2 used for a television game apparatus.

Referring to FIG. 4, there is shown the game machine of FIG. 2 used for a television game apparatus. Reference numeral 20 represents a television receiver. Reference numeral 21 represents a signal line connecting the game machine 1 and the television receiver 20. Reference designation 4a represents an operation button for operating the main switch 4. Reference numerals 22 and 23 represent operation members for playing the game, each of which is provided with an operation button. The game software apparatus 5 is inserted into the game machine 1 from the upside.

While a game machine is described herein, the use of the present invention is not limited to a game machine; the present invention may be employed for various apparatus where it is necessary to maintain a function while the power is being cut. The present invention may be employed, for example, for a machine tool. While the ROM 12 of FIG. 2 stores a program for a game, when the program stored in the ROM 12 is a program for a purpose other than a game, the apparatus designated by 5 serves as a different apparatus. In any case, the apparatus designated by 5 not only supplies a function but also maintains a function while the power is being cut.

As described above, according to the present invention, since the first controlling circuit (decoder 7) for controlling the first memory having a series of function data, the second controlling circuit (decoder 8) for maintaining data stored in the second memory and the power changeover circuit 9 are provided on a one-chip semiconductor substrate, the number of parts is small, and necessary connection operations and the space for installation are reduced. Since the signal processing line is short with respect to each of the first and second controlling circuits, the signal delay is reduced, so that the problem that the timing does not concur with that of another circuit is not caused. Further, since the power changeover circuit in the form of an IC can be constituted by a device in which no voltage drop occurs or the voltage drop is small, the problem of the power loss due to the voltage drop by the power changeover circuit is overcome.

Obviously, many modifications and variations of the present invention are possible in light of the above teachings. It is therefore to be understood that within the scope of the appended claims, the invention may be practiced other than as specifically described.

What is claimed is:

1. An apparatus operated by a central processing unit, comprising:

a first memory for storing a control program;

a second memory for storing an address of the control program;

specifying means, associated with said central processing unit, for specifying an address to be stored in the second memory;

a first controlling circuit for outputting a data from the first memory according to a data from the central processing unit;

a second controlling circuit for writing said address data of the control program into the second memory according to a data from the central processing unit;

a first power source for a normal operation;

a second power source for backup purpose;

a first power line connected to the first power source, to the first memory and to the first controlling circuit;

a second power line connected to the second power source; and a changeover circuit for connecting the second controlling circuit and the second memory to the first power line when a power is supplied from the first power source to the first power line and for connecting the second controlling circuit and the second memory to the second power line when no power is supplied from the first power source to the first power line, wherein said first and second controlling circuits and said changeover circuit are provided on a one-chip semiconductor substrate.

2. An apparatus according to claim 1, wherein said apparatus is a game apparatus and wherein said first and second memories and said one-chip semiconductor substrate are provided for a game software apparatus, and said central processing unit and said specifying means are provided for a game machine.

3. An apparatus according to claim 1, wherein a game software apparatus is detachably attached to a game machine.

4. An apparatus according to claim 1, wherein said first controlling circuit includes a first decoder which decodes address data from the central processing unit to supply an address signal to the first memory and wherein said second controlling circuit includes a second decoder which decodes address data transmitted from the central processing unit to select the second memory, said second decoder supplying an output thereof to the second memory.

5. An apparatus operated by a central processing unit, comprising:

an input terminal for inputting and address data from the central processing unit;

a first power terminal for inputting a first power;

a second power terminal for inputting a second power;

a first output terminal for outputting an address signal for reading out a data stored in a read only memory for a program;

a second output terminal for outputting an address signal for a random access memory which stores an address of the read only memory for the program;

a first decoder for decoding the address data input through the input terminal to supply the address data to the first output terminal;

a second decoder for decoding the address data input through the input terminal to supply an address signal to the second output terminal; and a changeover circuit for connecting the second decoder and the second output terminal to the first power terminal when a power is supplied to the first power terminal and for connecting the second decoder and the second output terminal to the second power terminal when no power is supplied to the first power terminal, wherein said apparatus is formed as a one-chip semiconductor and wherein said read only memory and said random access memory are not formed on said one-chip semiconductor.

6. An apparatus operated by a central processing unit, comprising:

a first memory for storing a control program;

a second memory for storing an address of the control program;

specifying means for specifying an address to be stored in the second memory;

a first controlling circuit for outputting a data from the first memory according to a data from the central processing unit;

a second controlling circuit for writing said address data of the control program into the second memory according to a data from the central processing unit;

a first power source for a normal operation;

a second power source for backup purposes;

a first power line connected to the first power source, to the first memory and to the first controlling circuit;

a second power line connected to the second power source; and a changeover circuit for connecting the second controlling circuit and the second memory to the first power line when a power is supplied from the first power source to the first power line and for connecting the second controlling circuit and the second memory to the second power line when no power is supplied from the first power source to the first power line, wherein a manually operated member is provided, and wherein when the manually operated member is operated during an execution of the control program, the specifying means and the second controlling circuit operate so that the address of the control program at the time is stored in the second memory without stopping the execution of the control program.

* * * * *